United States Patent
Wang et al.

(10) Patent No.: US 7,339,794 B1
(45) Date of Patent: Mar. 4, 2008

(54) STACKED MEMORY MODULE IN MIRROR IMAGE ARRANGEMENT AND METHOD FOR THE SAME

(75) Inventors: Wei-Hsiang Wang, Taipei (TW); Wen-Jeng Fang, Taipei (TW)

(73) Assignee: Transcend Information, Inc., Taipei (TW)

( * ) Notice: Subject to any disclaimer, the term of this patent is extended or adjusted under 35 U.S.C. 154(b) by 0 days.

(21) Appl. No.: 11/585,157

(22) Filed: Oct. 24, 2006

(51) Int. Cl.
*H05K 7/00* (2006.01)

(52) U.S. Cl. .................. 361/760; 257/686; 257/738

(58) Field of Classification Search ........... 174/260; 257/738, 321; 361/728, 760, 749
See application file for complete search history.

(56) References Cited

U.S. PATENT DOCUMENTS 6,347,735 B1* 2/2002 Frantz et al. ......... 228/180.22

2004/0262734 A1* 12/2004 Yoo .................... 257/686
2006/0049504 A1* 3/2006 Corisis et al. ......... 257/686

\* cited by examiner

*Primary Examiner*—Randy W. Gibson
*Assistant Examiner*—Abiy Getachew
(74) *Attorney, Agent, or Firm*—Rosenberg, Klein & Lee

(57) ABSTRACT

A stacked memory module is manufactured in mirror image arrangement and a method for the same. The pins of a first memory unit and pins of a second memory unit are electrically connected to an upper face and a lower face of a first printed circuit board made of rigid material. The pins of the second memory unit are in mirror image arrangement with respect to the pins of the first memory unit. Two second PCBs are made of flexible material and electrically connected to both sides of the first PCB. Conductive contacts such as gold fingers are electrically connected to circuit on the second PCB. The manufacture cost is reduced and manufacture process is simplified. The signal quality is enhanced because the signal paths are uniform and the load impedance is reduced.

14 Claims, 5 Drawing Sheets

STACKED MEMORY MODULE IN MIRROR IMAGE ARRANGEMENT AND METHOD FOR THE SAME

BACKGROUND OF THE INVENTION

1. Field of the Invention

The present invention relates to a stacked memory module in mirror image arrangement and method for the same, especially to a stacked memory module with two memory units on upper face and lower face of a rigid printed circuit board and two flexible printed circuit board on both sides of the rigid printed circuit, and method for the same.

2. Description of the Prior Art

The processing speed of computer device increases as the progress of technology. The performance of memory is important beside the processing speed of CPU. The conventional computer memory modules generally comprise a plurality of memory units (memory ICs) arranged on carrier (such as printed circuit board) in array fashion. The development trend for memory module is compact and lightweight.

Multi-layer stacked memory module is a design for compact size and high capacity. Taiwan patent gazette No. 091123613 and No. 091221281 disclose that a memory unit is stacked to another memory unit, where the corresponding pins of the memory unit are electrically connected and signal can be conveyed therebetween. The pins of the memory units are toward the same direction. The memory module is packaged by board-on-chip packages and this technology is suitable for high speed Dynamic Random Access Memory (DRAM) or other memories. This package is especially suitable for Dual Inline Memory Module (DIMM) and provides improvement for pin connection between two memory units.

However, the signal lines for the stacked memory have non-uniform length and the load impedance might be increased with the stacked structure. The signal integrity is influenced and the signal is not stable. Moreover, the pins of two memory units should have mirror symmetry when the stacked structure is applied to the DIMM memory. The cost is increased due to circuit design and package requirement.

SUMMARY OF THE INVENTION

It is an object of the present invention to provide a method for stacked memory module in mirror image arrangement to simplify process and reduce cost.

It is another object of the present invention to provide a stacked memory module in mirror image arrangement to enhance signal quality by uniform signal lines.

Accordingly, the present invention provides a method for stacked memory module in mirror image arrangement, comprising:

(1). electrically connecting pins of a first memory unit to an upper face of a first printed circuit board (PCB);

(2). electrically connecting pins of a second memory unit to the pins of the first memory unit in mirror image manner and connecting to a lower face of a first printed circuit board (PCB); and (3). electrically connecting two second PCBs on both sides of the first PCB and the second PCB comprising a plurality of conductive contacts corresponding to circuits on the second PCB.

Accordingly, the present invention provides a stacked memory module in mirror image arrangement, comprising: a first memory unit; a second memory unit; a first printed circuit board (PCB); two second PCBs; and a plurality of conductive contacts. The pins of the first memory unit and the second memory unit are electrically connected to an upper face and a lower face of the first PCB. The pins of the second memory unit are in mirror image arrangement with respect to the pins of the first memory unit. The two second PCBs are electrically connected to both sides of the first PCB and the conductive contacts are electrically connected to circuit on the second PCB.

BRIEF DESCRIPTION OF THE DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1:
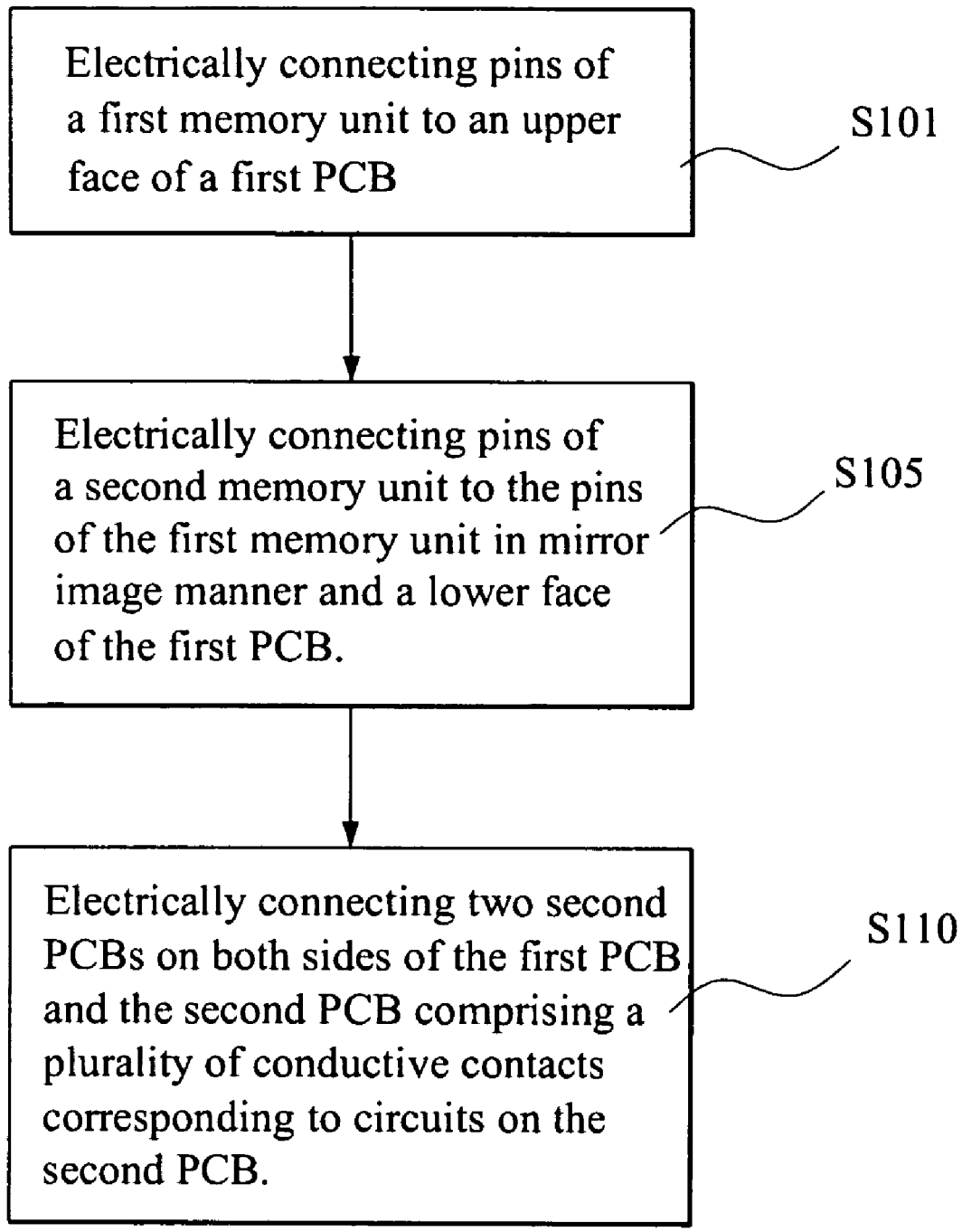
FIG. 1 shows the flowchart of stacking method for the stacked memory with mirror image structure.

FIG. 1 shows the flowchart of stacking method for the stacked memory with mirror image structure. In step S101 the pins of a first memory unit are electrically connected to an upper face of a first printed circuit board (PCB), where electronic circuits are arranged on the first PCB. In step S105 a second memory unit is provided with the pins thereof being mirror image to the pins of the first memory unit, where the pins of the second memory unit are arranged on lower face of the first PCB. Therefore, the data of the second memory unit can be sent to the first memory unit through the first PCB.

In step S110, two second PCBs are electrically connected to both sides of the first PCB, where electronic circuits of the two second PCBs are electrically connected to the electronic circuits of the first PCB for conveying data and signal therebetween. The second PCBs are provided with conductive contacts such as gold finger. The conductive contacts are also electrically connected to the electronic circuits of the two second PCBs to provide electrical connection for other electronic devices.

In the present invention, the first PCB is made of rigid material such as FR4 grade glass and epoxy or other material suitable for printed circuit board. The second PCB can be made of flexible material such as Flexible Printed Circuits (FPC). Therefore, the second PCB can be bent while the circuits thereon have normal function. The conductive contacts are further provided with conductive medium for connecting to other electronic components, carrier, circuits or printed circuit board. The conductive medium can be, for example, tin ball or tin paste.

The pins of the first memory unit and the second memory unit can be realized by metal wire, conductive block or other conductors. The conductive block is preferably tin ball. The pins of the first memory unit and the second memory unit can be arranged in Ball Grid Array (BGA), DIMM or other suitable manner.

In the present invention, the memory units are in mirror image arrangement. The impedance of signal line and the signal path can be more uniform to enhance signal quality.

It should be noted that the above-mentioned steps in the preferred embodiment are only used for explanation and not limit of the present invention.

Figure 2:
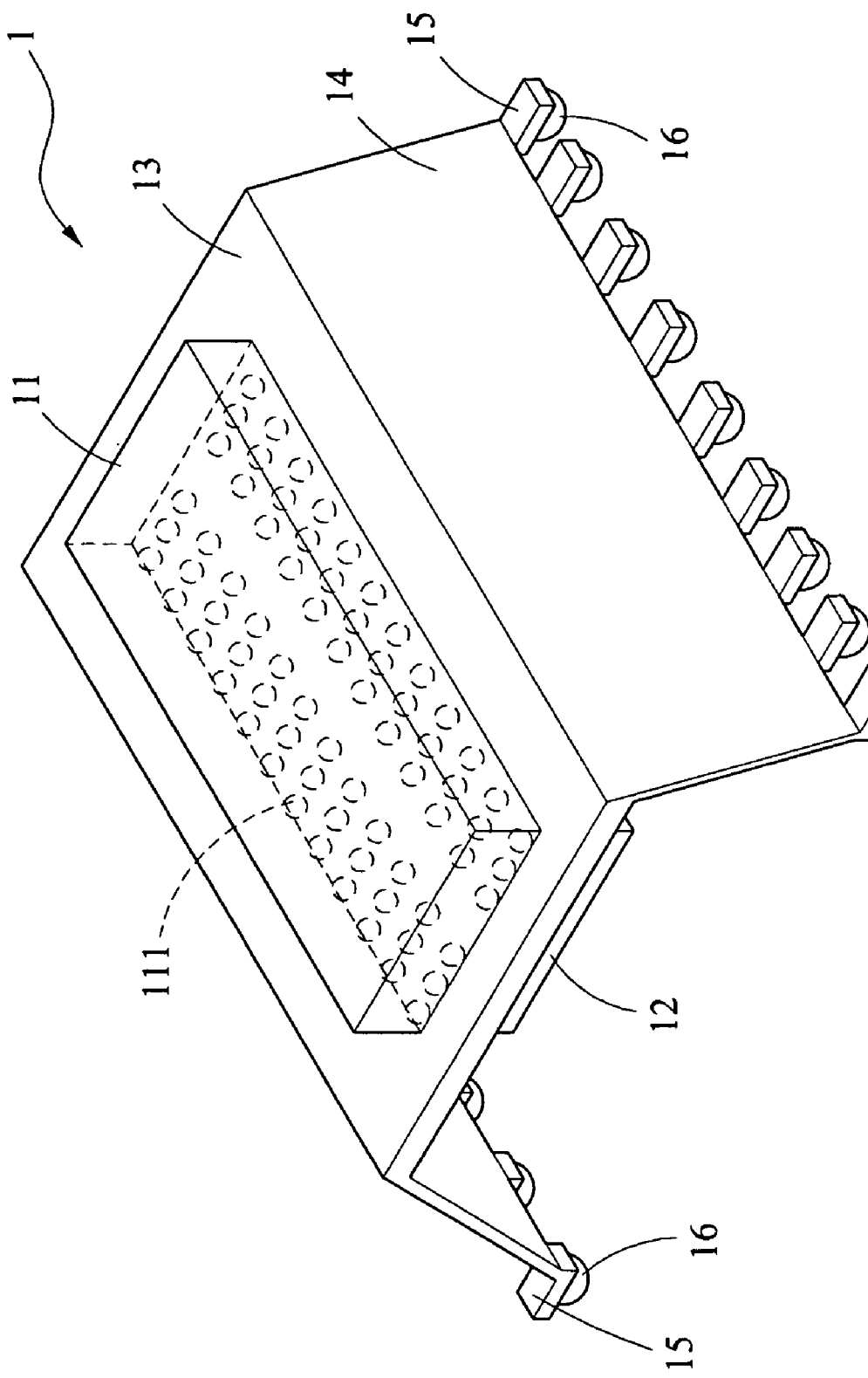
FIG. 2 is a perspective view of the first preferred embodiment of the present invention.
Figure 3:
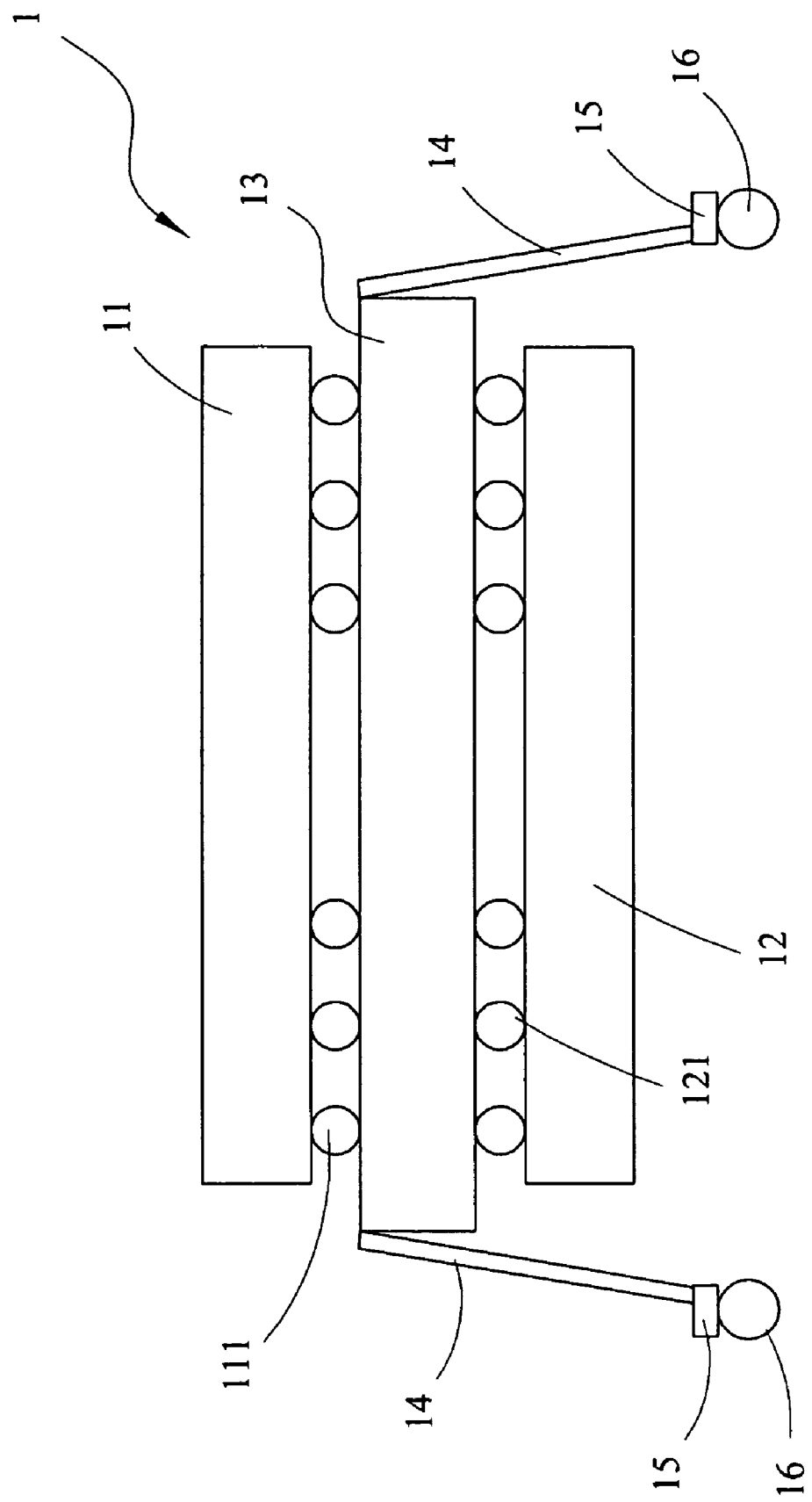
FIG. 3 is a front view of the first preferred embodiment of the present invention.
Figure 4:
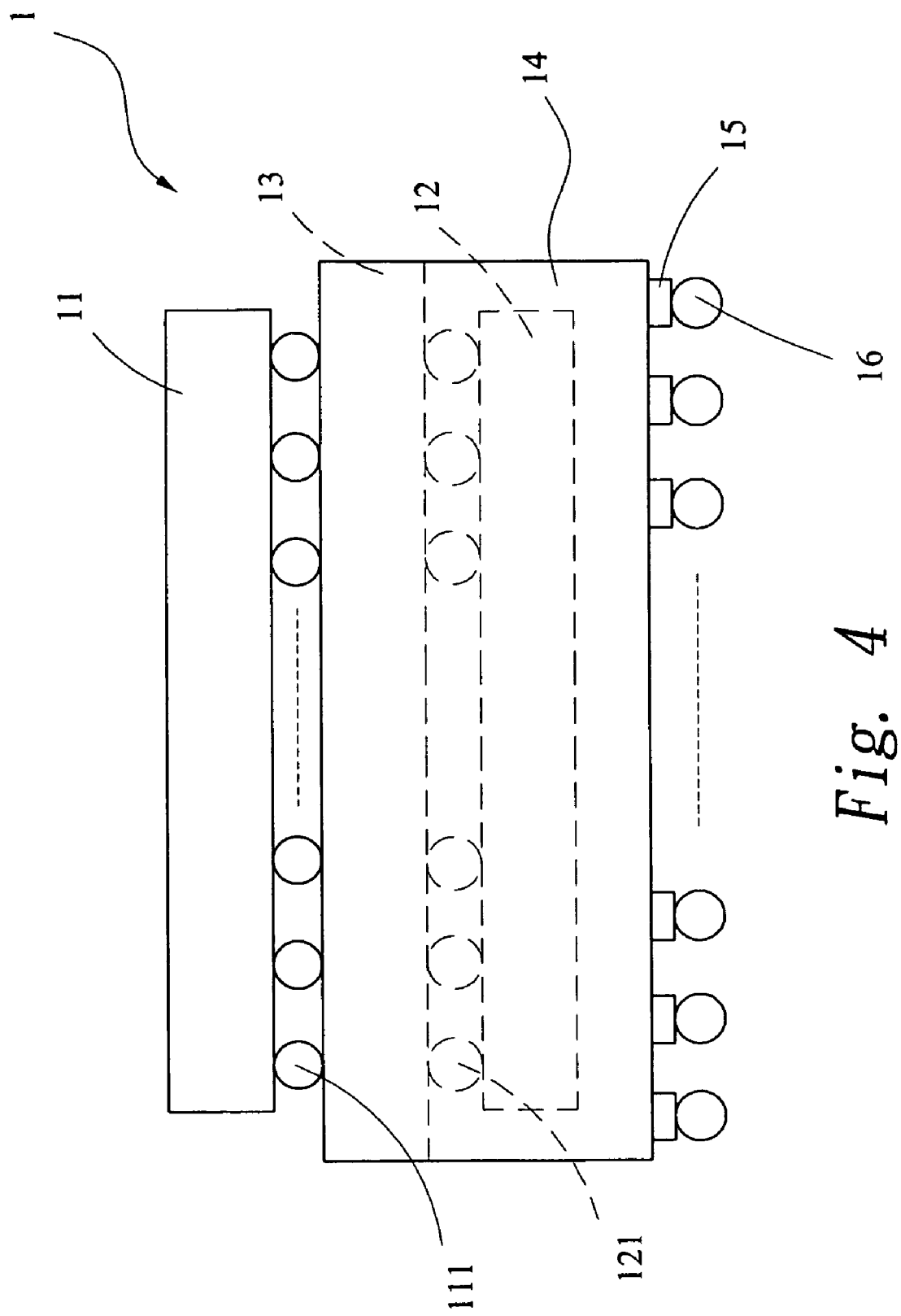
FIG. 4 is a sectional view of the first preferred embodiment of the present invention.

With reference to FIGS. 2 to 4, the shown memory module is manufactured according to the first preferred embodiment of the present invention. The memory module 1 comprises a first memory unit 11, a second memory unit 12, a first PCB 13, two second PCBs 14 and a plurality of conductive contacts 15 extended from edge of the second PCBs 14. The pins 111 of the first memory unit 11 and the pins 121 of the second memory unit 12 are connected to upper face and lower face of the first PCB 13, respectively. The pins 121 of the second memory unit 12 are in mirror image to the pins 111 of the first memory unit 11. Therefore the first memory unit 11 and the second memory unit 12 can send data and signal therebetween through the first PCB 13.

In the present invention, the two second PCBs 14 are electrically connected to both sides of the first PCB 13 and the conductive contacts 15 are electrically connected to circuits on the second PCBS 14. The conductive contacts 15 can be realized by conductive elements such as gold finger. The conductive contacts 15 are further provided with conductive medium 16 for electrical connection with other electronic components, carriers, circuits and print circuit boards. In the preferred embodiment, the conductive medium 16 can be tin balls.

In the present invention, the first PCB 13 is made of rigid material such as FR4 grade glass and epoxy or other material suitable for printed circuit board. The second PCB 14 can be made of flexible material such as Flexible Printed Circuits (FPC). Therefore, the second PCB 14 can be bent while the circuits thereon have normal function.

In the present invention, the pins 111 of the first memory unit 11 and the pins 121 of the second memory unit 12 are realized by conductive block, which can be tin balls. The conductive block can be formed as BGA package on the first PCB 13. Moreover, the pins 111 of the first memory unit 11 and the pins 121 of the second memory unit 12 can be arranged on the first PCB 13 with conductive block for electrical connection and fixed arrangement.

Figure 5:
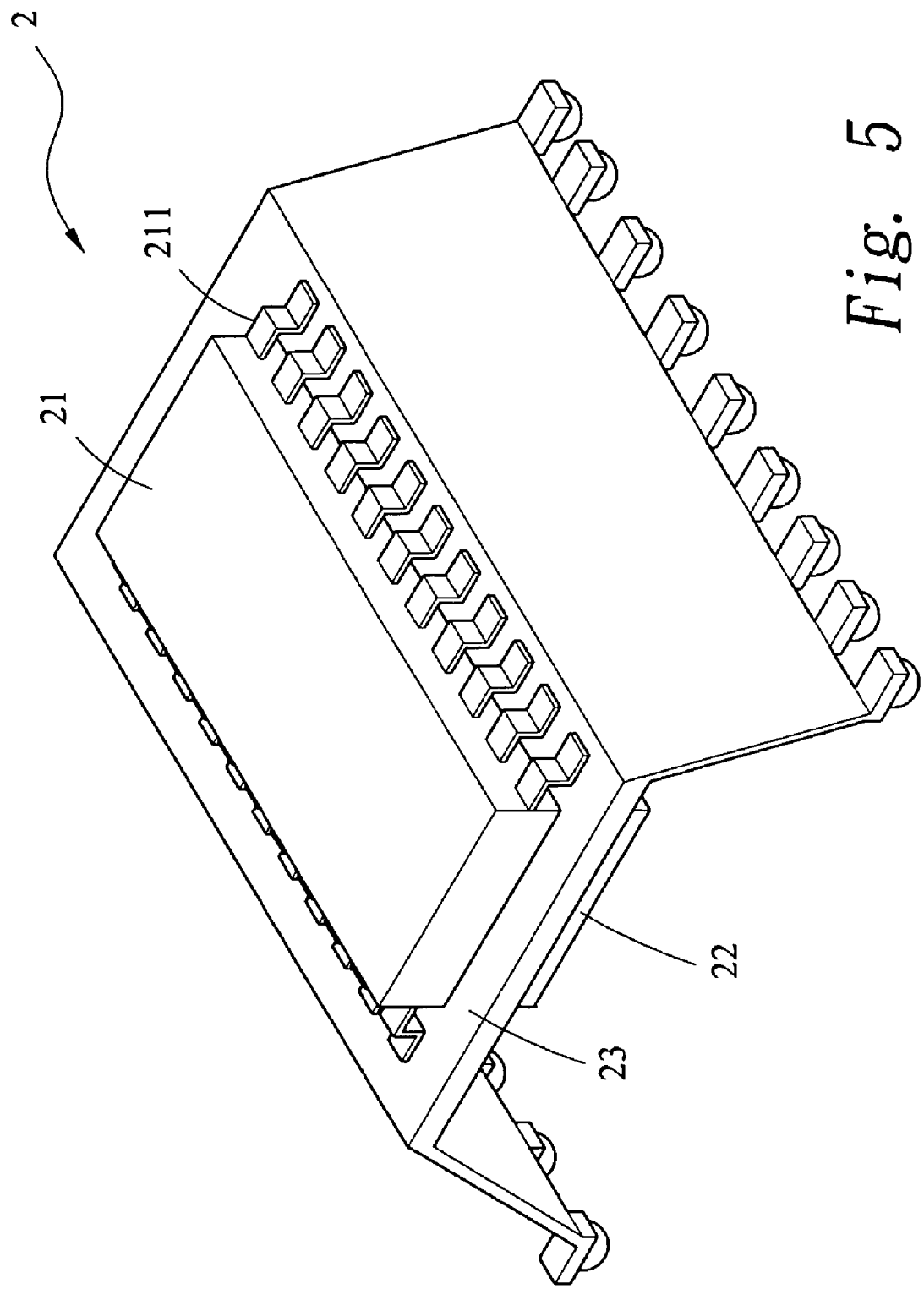
FIG. 5 is a perspective view of the second preferred embodiment of the present invention.

FIG. 5 shows the second preferred embodiment of the present invention. The memory module 2 according to the second preferred embodiment of the present invention comprises a first memory unit 21 electrically connected to a first PCB 23 and a second memory unit 22 electrically connected to the first PCB 23. The pins 211 of the two memory units 21 and 22 are arranged in mirror image. Different to that in the first preferred embodiment, the pins 211 of the two memory units 21 and 22 are made of metal wires and arranged on both sides of the memory units 21 and 22. The pins 211 can be soldered or glue-pasted to the first PCB 23, while the pins 211 of the first memory unit 21 are corresponding to the pins 211 of the second memory unit 22.

As can be seen from above description, the memory module is in stacked and mirror image arrangement. Therefore, signal paths have optimal topology. The manufacture cost is reduced and manufacture process is simplified. The signal quality is enhanced because the signal paths are uniform and the load impedance is reduced.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A method for connecting a memory module with mirror image arrangement, comprising:
   a. electrically connecting pins of a first memory unit to an upper surface of a first printed circuit board (PCB);
   b. electrically connecting pins of a second memory unit to the pins of the first memory unit in a mirror image manner and connecting the pins of the second memory unit to a lower surface of the first printed circuit board (PCB);
   c. electrically connecting a second printed circuit board on a first side of the first PCB, the second PCB comprising a plurality of conductive contacts corresponding to circuits thereon; and
   d. electrically connecting a third printed circuit board on an opposing second side of the first printed circuit board, the third printed circuit board including a plurality of conductive contacts corresponding to circuits thereon.

2. The method as in claim 1, wherein the first PCB is made of a rigid material and the second and third printed circuit boards are made of a flexible material.

3. The method as in claim 1, wherein the conductive contact further comprises conductive medium for electrical connection.

4. The method as in claim 1, wherein the pins of the memory unit are made of metal wire.

5. The method as in claim 1, wherein the pins of the memory unit are made of conductive block.

6. The method as in claim 5, wherein the conductive block is tin ball.

7. The method as in claim 1, wherein the pins of the memory unit are arranged in BGA fashion.

8. A stacked memory module in mirror image arrangement, comprising:
   a first printed circuit board having an upper surface, a lower surface, a first side and an opposing second side;
   a first memory unit having a plurality of pins, said plurality of pins of said first memory unit being coupled to said upper surface of said first printed circuit board;
   a second memory unit having a plurality of pins, said plurality of pins of said second memory unit being coupled to said lower surface of said first printed circuit board;
   a second printed circuit board having a plurality of conductive contacts, said second printed circuit board being electrically coupled to said first side of said first printed circuit board; and
   a third printed circuit board having a plurality of conductive contacts, said third printed circuit board being electrically coupled to said opposing second side of said first printed circuit board;
   wherein said plurality of pins of the second memory unit are in mirror image arrangement with respect to the pins of the first memory unit.

9. The stacked memory module as in claim 8, wherein the first PCB is made of a rigid material and the second and third printed circuit boards are made of a flexible material.

10. The stacked memory module as in claim 8, wherein the conductive contacts respectively include conductive mediums for electrical connection.

11. The stacked memory module as in claim 8, wherein the pins of the memory unit are made of metal wire.

12. The stacked memory module as in claim 8, wherein the pins of the memory unit are made of conductive block.

13. The stacked memory module as in claim 12, wherein the conductive block is tin ball.

14. The stacked memory module as in claim 8, wherein the pins of the memory unit are arranged in BGA fashion.

* * * * *